United States Patent [19]

Flugan

[11] Patent Number: 4,717,881
[45] Date of Patent: Jan. 5, 1988

[54] RADIO FREQUENCY COILS FOR NUCLEAR MAGNETIC RESONANCE IMAGING SYSTEMS

[75] Inventor: David C. Flugan, Hudson, Ohio

[73] Assignee: Technicare Corporation, Solon, Ohio

[21] Appl. No.: 798,669

[22] Filed: Nov. 15, 1985

[51] Int. Cl.[4] .......................................... G01R 33/20
[52] U.S. Cl. ................................... 324/322; 324/318
[58] Field of Search ............... 324/307, 309, 318, 319, 324/320, 322

[56] References Cited

U.S. PATENT DOCUMENTS

| | | | |
|---|---|---|---|
| 3,242,424 | 3/1966 | Redfield | 324/322 |
| 4,129,822 | 12/1978 | Traficante | 324/322 |
| 4,219,775 | 8/1980 | Bozanic et al. | 324/313 |
| 4,450,408 | 5/1984 | Tiemann | 324/318 |
| 4,620,155 | 10/1986 | Edelstein | 324/318 |
| 4,633,181 | 12/1986 | Murphy-Boesch et al. | 324/322 |
| 4,646,018 | 2/1987 | Brown | 324/303 |
| 4,649,348 | 3/1987 | Flugan | 324/318 |
| 4,680,549 | 7/1987 | Tanttu | 324/318 |

OTHER PUBLICATIONS

E. Boskamp, Application of Surface coils in MR Imaging, Medicamundi, vol. 29, No. 2, 1984.

Primary Examiner—Stewart J. Levy
Assistant Examiner—Scott M. Oldham
Attorney, Agent, or Firm—W. Brinton Yorks, Jr.

[57] ABSTRACT

Radio frequency apparatus for a magnetic resonance system is provided which includes an r.f. coil and DC controlled circuitry for selectively altering the characteristics of the coil. A loading coil is provided which is selectively activated to de-Q the coil during r.f. transmission so as to minimize the loading effects of the subject and their effect on coil impedance. A switched network is provided which selectively destroys the normal resonant condition of the coil when a second r.f. coil is operative to minimize interaction between the two coils.

5 Claims, 6 Drawing Figures

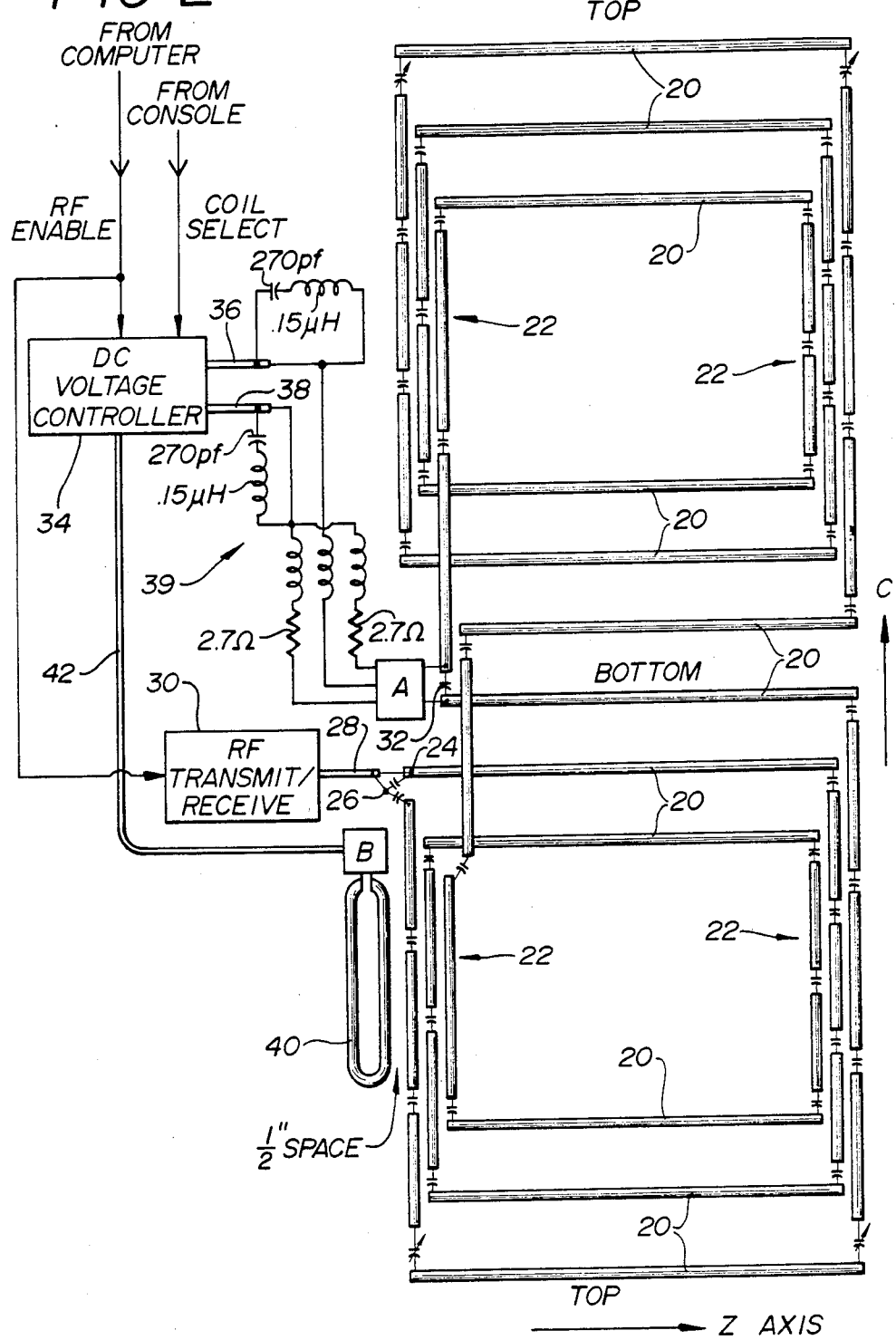

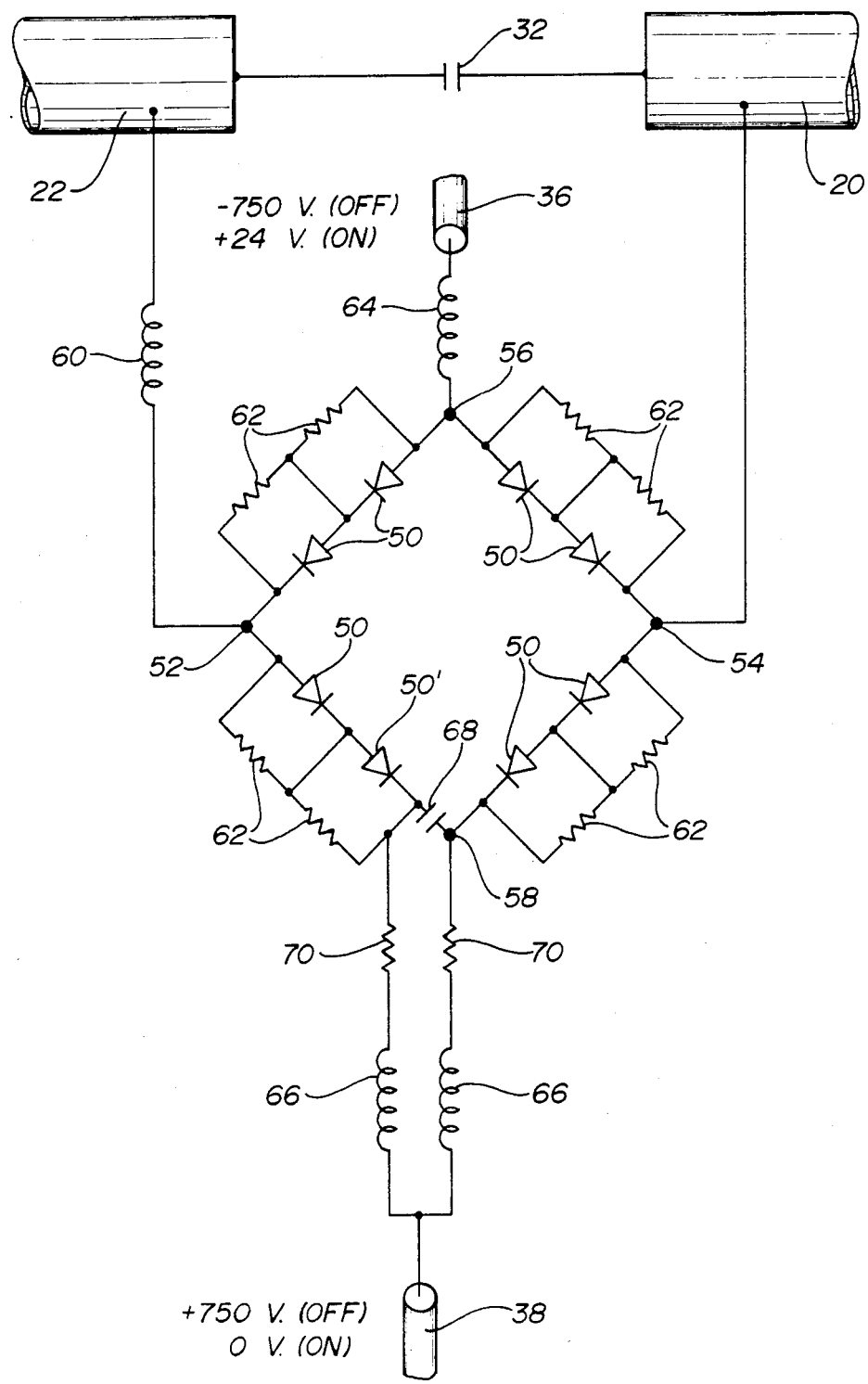

RADIO FREQUENCY COILS FOR NUCLEAR MAGNETIC RESONANCE IMAGING SYSTEMS

This invention relates to nuclear magnetic resonance imaging systems and, in particular, to a family of radio frequency (r.f.) coils and associated circuitry for inducing and detecting nuclear magnetic resonance (NMR) signals in a subject being imaged.

In an NMR imaging system, r.f. signals are used to excite the nuclei of a subject in the presence of a static magnetic field. During excitation, the moments of spinning nuclei which are aligned with the static magnetic field are reoriented, or "tipped", into a different directional orientation, from which they will subsequently emit detectable r.f. signals. The excitation may be done selectively; that is, through the simultaneous application of gradient r.f. fields to the subject, only those nuclei located in a specific spatial plane or planes of the subject will be subject to a magnetic field which matches, or creates resonance in response to, the frequencies of the applied r.f. excitation signals. Through application of additiinal magnetic field gradients, the spins of nuclei in the selected plane or planes can be spatially encoded in several dimensions so that the detected NMR signals can be processed to form an image of a plane or planes of the subject.

It is desirable for the r.f. coil that is receiving the NMR signals emitted by the tipped nuclei to exhibit a high Q, for maximum sensitivity to the NMR signals. An NMR imaging system with these r.f. signal characteristics will desirably exhibit a high signal to noise ratio.

It is further desirable that the r.f. field developed during excitation be highly uniform. A highly homogenous r.f. field will cause the selected nuclei to be uniformly tipped into the desired orientation. Without this tip angle uniformity, artifacts will be present in the resulting NMR images.

It is also desirable to consider the tuning characteristics of r.f. coils during their various modes of operation. During the receive mode, when the coil is receiving NMR signals, it should be precisely tuned to the frequency band of the received signals. An r.f. coil which is precisely tuned so as to be particularly sensitive to a narrow frequency band is generally referred to as a high Q coil.

During the transmit mode in an NMR medical imaging system, additional considerations come into play. When a large subject such as a human is placed inside the coil field, the resistive and inductive properites of the body interact with the coil. In effect, the body becomes a series load to the coil, the magnitude of which will depend upon the size of the particular person. This loading will vary the impedance of the coil, and the coil will present a different impedance to the r.f. transmitter than its nominal impedance. The impedance mismath between the transmitter and the coil will detrimentally affect the response of the r.f. system. In accordance with the principles of the present invention, the resonant characteristics of the coil during transmit are altered so that the r.f. coil becomes a low Q coil. A low Q coil is moderately sensitive to a broader band of frequencies than a high Q coil. Thus, any shift in resonance caused by the human patient is to a frequency still within the tuned range of the relatively low Q coil. This relatively low Q characteristic minimizes the tune-up time before imaging when tip angle missettings are resolved, as discussed below.

The third mode of operation comprises times when the r.f. coil is not being used and transmission or reception is being performed by another r.f. coil. During these times it is desirable to prevent interaction between the two coils which can detune the active r.f. coil, as discussed in U.S. Pat. No. 4,649,348. That patent discusses several passive techniques for preventing or minimizing coil interaction, wherein induced r.f. currents effect detuning of the inactive r.f. coil. In accordance with a further aspect of the present invention, an r.f. coil is controllably detuned to prevent interaction with other active r.f. coils in the NMR imaging system.

IN THE DRAWINGS

FIG. 2 illustrates an r.f. coil for an NMR system together with associated circuitry in accordance with the principles of the present invention;

Figure 5:
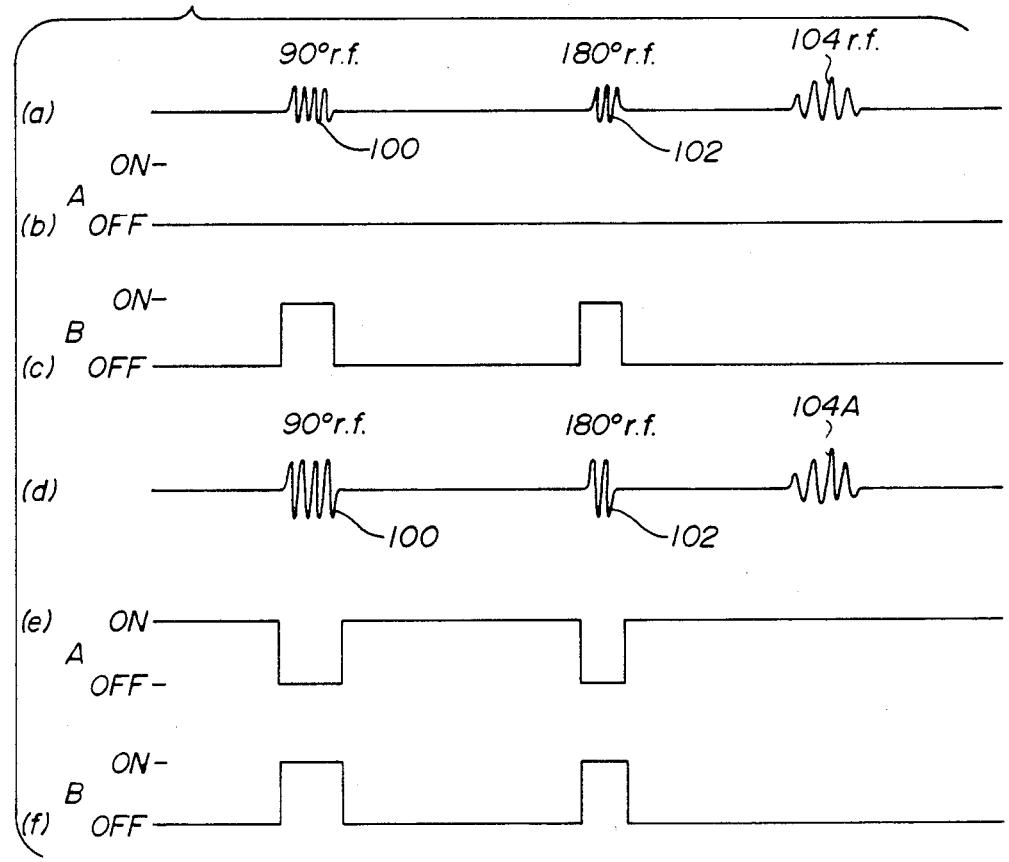
Figure 4A:
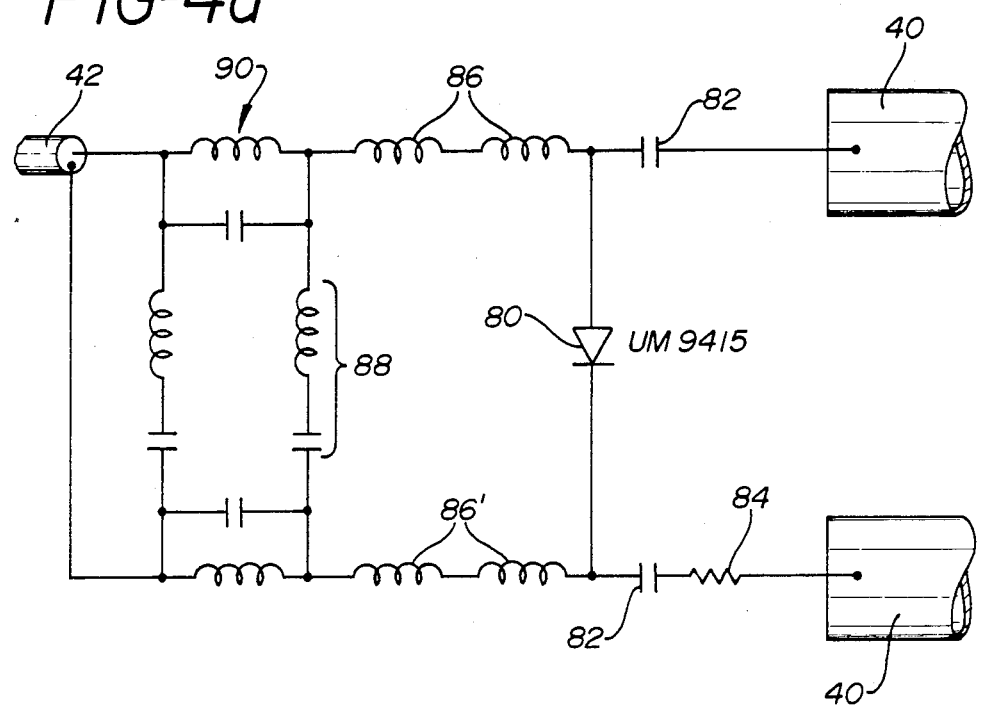
Figure 4B:
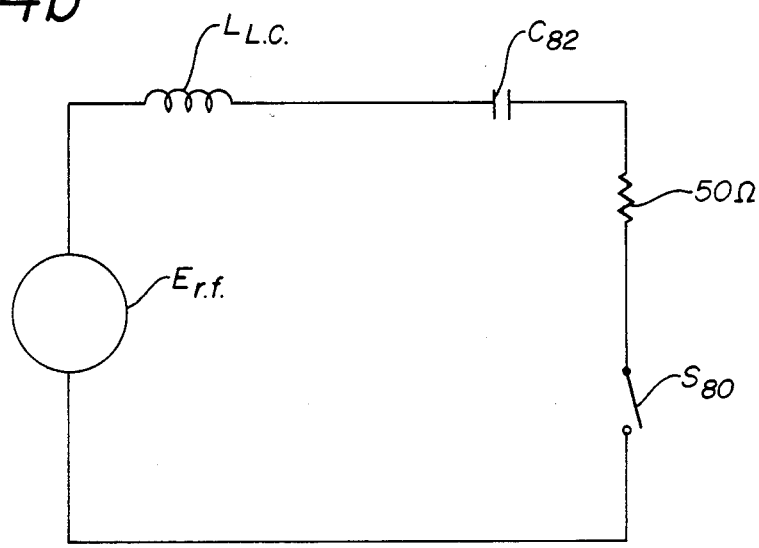

FIG. 3 schematically illustrates one of the switched circuits of FIG. 2;

FIGS. 4a and 4b illustrate the circuitry and operation of another switched circuit of FIG. 2; and FIG. 5 illustrates typical typical sequences of operation of an NMR imaging system constructed in accordance with the principles of the present invention.

Figure 1:
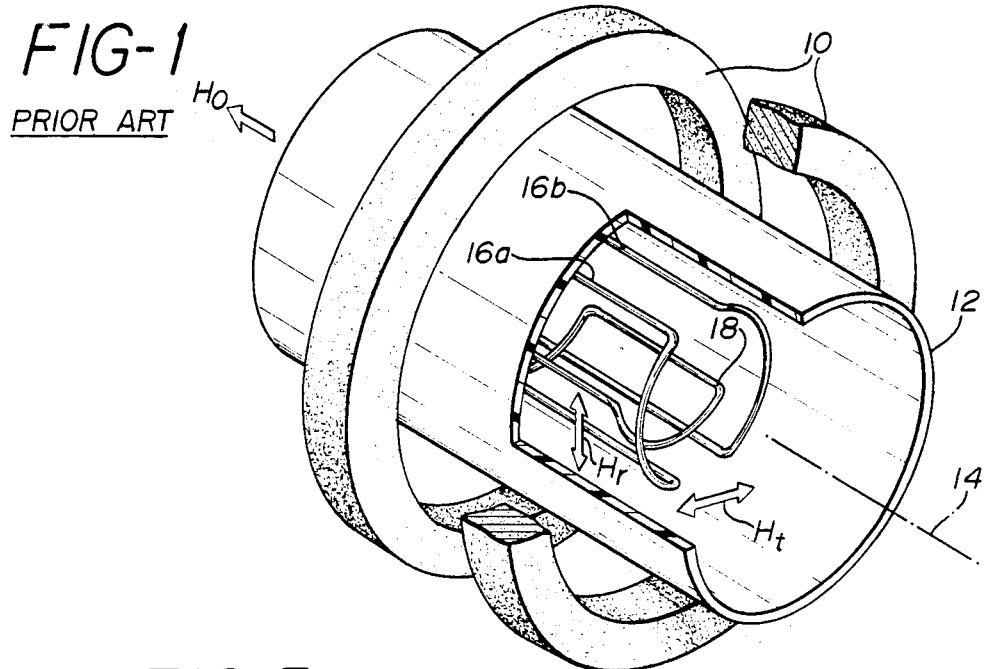
FIG. 1 illustrates major components of an NMR imaging system.

Referring first to FIG. 1, and NMR imaging system is shown. The system includes a magnet 10, which may be a resistive or superconducting magnet, and creates a static magnetic field $H_o$. By virtue of the cylindrical shape and orientation of the magnetic, the $H_o$ static field is directed horizontally in line with the bore through the center of the magnet 10. An axis 14 extends through the center of the magnet bore, and is taken as the z axis of the three-dimensional space inside the magnetic bore.

Inside the magnet bore is a cylindrical coil form 12 made of a nonferrous material. Gradient coils for the x, y, and z directions are wound about the coil form 12. For clarity of illustration of the gradient coils are not shown in FIG. 1. These gradient coils may be configured about the coil form 12 as described in U.S. Pat. No. 4,456,885, entitled "GRADIENT COIL APPARATUS FOR A MAGNETIC RESONANCE SYSTEM".

In the system shown in FIG. 1, a transmitting r.f. coil and a receiving r.f. coil are located inside the coil form 12. The transmitting coil is composed of two vertically oriented saddle-shaped coils 16a and 16b which oppose each other in a cylindrical configuration. Each coil 16a and 16b has curved end coil segments which each circumscribe an arc of approximately 120 degrees. The horizontal straight coil segments which interconnect the curved end segments vertically oppose each other on each coil 16a and 16b. Thus, when energized, the transmitting coil will produce an r.f. field $H_t$ in the horizontal direction, orthogonal to the center axis 14 of the magnet as shown by the arrow indicated as $H_t$.

Located within the volume surrounded by coils 16a and 16b is a receiving coil 18. The receiving coil 18 is also saddle-shaped, and has curved end segments which circumscribe an arc chosen as a function of the specific region from which NMR signals are to be received. The horizontal straight coil segments which interconnect the curved end segments of the receiving coil 18 oppose each other in a horizontal plane. The receiving coil 18 thus exhibits an r.f. field $H_r$ for received signals which is vertically oriented, as indicated by the arrow designated $H_r$.

FIG. 2 illustrates an r.f. coil and associated circuitry constructed in accordance with the principles of the present invention. The FIG. 2 representation shows a saddle coil which has been effectively unrolled and flattened out, as the coil segments would appear before being curved for assembly. When the coil is formed, the end segments 22 are curved so that the final configuration is cylindrical, with the conductors marked "top" being adjacent to each other and opposing the "bottom" conductors. The circumferential direction is indicated at "C". The coil is similar to saddle coil 16a and 16b of FIG. 1, and includes conductors 20 and 22 comprised of hollow five-eights inch diameter copper tubes. However, instead of being formed of continuous tubes as in FIG. 1, the r.f. coil of FIG. 2 is divided by forty-two splits, across which are coupled respective tuning capacitors. The interconnecting capacitors have values of about 130PF. The split conductors serve to more evenly distribute r.f. energy throughout the coil, thereby preventing the formation of high energy "hot sports" around the coil. This provides for a more uniform r.f. field.

In addition, whereas the 16a, 16b coil of FIG. 1 only has two opposing saddle-shaped coils, the r.f. coil of FIG. 2 has several distributed saddle-shaped conductors. There are twelve conductors 20 distributed about the running in parallel with the direction of the z axis. These conductors are interconnected by a number of curved end segments 22. By following the interconnected conductors and capacitors, it may be seen that the coil is a series connected arrangement, driven during transmit by r.f. signals applied at poins 24 and 26, where the coil is connected to coaxial cable 28. The coaxial cable 28 also conducts signals received by the r.f. coil during he receive mode of operation. The coaxial cable 28 is connected to a conventional NMR r.f. transmitter/receiver unti 30 which transmits and receives r.f. signals.

A switched network A is connected across one of the coil capacitors 32. Network A comprises a diode bridge, shown in detail in FIG. 3, which is switched to either place inductor 60 in parallel with capacitor 32 of to operate as an effective open circuit across capacitor 32. Network A is switched by direct current (DC) signals applied by a DC voltage controller 34. DC control voltages are applied to network A by way of an anode line 36 and a cathode line 38, which lines are connected to network A by r.f. chokes and filter components shown at 39. These components 39 serve to keep r.f. signal energy out of the DC voltage supplies of the controller 34.

A switched network B and a loading coil 40 are also shown in FIG. 2. The loading coil 40 is physically located about one-half inch from one or more of conductors 20, 22 so that the loading coil can be inductively coupled to the r.f. coil. When switch B is open, the loading coil is effectively removed from the circuit and does not interact with the r.f. coil. when the switch is closed, the loading coil is tuned to the resonant frequency of the r.f. coil and is inductively coupled to the r.f. coil. Radio frequency energy is then coupled to the loading coil, thereby loading the r.f. coil and broadening its response characteristic so that it functions as a relatively low Q coil. The switch B is controlled by DC control voltages applied to the switch from the DC voltage controller 34 by way of coaxial cable 42.

Network A is shown in schematic detail in FIG. 3. A diode bridge is formed by eight IN4007 diodes 50, 50'. Junction point 52 is coupled to one side of r.f. coil capacitor 32 by an inductor 60, formed of about four turns of #16 wire wound in a half-inch diameter. Junction point 54 of the diode bridge is coupeld to the other side capacitor 32. Anode line 36 is coupled to junction point 56 of the diode bridge by way of an r.f. choke 64. A capacitor 68 breaks the DC path between diode 50' and junction point 58. Cathode line 38 is coupled to either side of capacitor 68 by parallel r.f. chokes 66 and resistors 70. Eight 15 Megohm resistors are coupled across respective ones of the diodes 50, 50'.

When the r.f. coil is transmitting or receiving, it operates in a resonsnt condition. During those times, voltages of ±750 v are applied to the diode bridge to strongly reverse bias the diodes. These voltages are sufficient to overcome the forward biasing potentials of the peaks of transmitted r.f. signals. In addition, the use of relatively low speed diodes prevents them from reacting to the 20 nsec half cycle times of a typical 25 MHz transmitted r.f. signal. With the diodes reverse biased, the network A and its inductor 60 are effectively removed from the r.f. coil, and provide no losses which would detune the r.f. coil.

When the auxiliary coil such as a head or surface coil is used to transmit and receive, or to receive NMR signals arising from excitation produced by transmission from the r.f. coil of FIG. 2, it is desirable to prevent any interaction between the r.f. coil and the active auxiliary col. During these times a DC voltage of +24 volts is applied to the anode line 36 and zero volts (ground) is applied to the cathode line 38. The diode bridge is now turned on, with the diodes being forward biased into conduction. Current of about 0.3 amps flows through the diodes, with resistors 70 serving to equalize the diode currents. The DC diode currents in the two halves of the diode bridge are separated by capacitor 68 so they will return to the cathode line 38 evenly through parallel resistors and inductors 70 and 66. When the diode bridge is turned on inductor 60 is effectively connected across capacitor 32, thereby detuning the r.f. coil and destroying its resonant condition. The detuned r.f. coil will therefore not interact with any auxiliary coil in the NMR system.

Network B is shown schematically in FIG. 4a. A load resistor 84 is coupled to one side of the split in the loading coil 40. The load resistor is coupled to the other side of the split by two tuning capacitors 82, separated by a PIN diode 80. Inductors 86 and 86' are coupled in parallel pairs to either side of the PIN diode. A tuned circuit 88 is coupled between pairs of the inductors 86, 86' and in parallel with the PIN diode. The tuned circuit 88 is coupled to coaxial cable 42 by a filter network shown at 90.

The operation of network B is illustrated by the simplified arrangement of FIG. 4b. The PIN diode 80 acts as a switch which is either open or closed, as shown by Switch $S_{80}$. The circuit of FIG. 4b is energized by r.f. energy inductively coupled into the loading coil from the r.f. coil, as indicated by $E_{r.f.}$. When switch $S_{80}$ is open, the circuit is broken. Radio frequency current cannot flow in the loop and the loading coil has no effect on the r.f. coil.

However, when switch $S_{80}$ is closed the circuit loop is completed and current will flow. The inductance $L_{LC}$ of the laoding coil is matched to the capacitance $C_{82}$ of capacitor 82 at the r.f. coil resonant frequency, and energy from the f.f. coil is dissipated by the 50 ohm load. This loading of the r.f. coil will spoil the Q of the coil, changing it from a high Q to a relatively low Q coil.

Turning back to FIG. 4a, the cable 42 is connected to apply a constant zero volts DC (ground) to the cathode of the PIN diode 80. When the PIN diode is to be switched on (conductive) to load the r.f. coil, a +24 v. DC potential is applied to the anode of PIN diode 80 through a ninety-one ohm resisor. Approximately one-quarter of an amp then forward biases the PIN diode. When the PIN diode is to be switched off (non conductive) it is reverse biased by a −24 v. DC potential is applied to the PIN diode. The tuning capacitors 82 are thus not coupled in series with the load resistor 84 and the loading coil 40 by the PIN diode 80. In addition, the series tuned circuit 88 is an r.f. short circuit at the resonant frequency, which acts to coupled inductors 86 to inductors 86'. The inductors 86, 86' are thus effectively in parallel with the capacitance of the reverse biased PIN diode 80. This parallel tuned circuit block r.f. signals coupling between the two tuning capacitors 82.

FIG. 5 illustrates two sequences of operation of the r.f. coil arrangement of FIG. 2. Line (a) of the FIGURE illustrates r.f. signals transmitted and received by the r.f. coil. A 90° r.f. signal 100 and 1 180° r.f. signal 102 are transmitted by the r.f. coil, and a spin echo signal 104 r.f. is received by the r.f. coil. Since transmission and reception is being performed by the same r.f. coil, there is no auxiliary coil in the system and no need to destroy the resonance of the r.f. coil. Thus, line (b) shows that network A is always in its off state and plays no part in the sequence. However, since it is desirable to peate the r.f. coil in its low Q state during transmission when a human subject is in the coil field, line (c) shows that network B is turned on during the times of r.f. transmission. Network B is not turned on during reception of the spin echo signal 104 r.f., so that the r.f. coil is highly sensitive for best signal reception and signal to noise performance. Since the r.f. coil is a low Q coil during transmit, ease of tuneup is afforded. The tuneup comprises transmitting r.f. signals and measuring tip angles (as indicated by the magnitude of the spin echo signal) to see that 90° and 180° tip angles are accurately achieved. Since the r.f. coil is loaded by the loading coil during transmission, the change of the coil impedance is minimized when different size people are placed in the coil. It has been found that there is no more than a 3 db deviation in the power required to achieve the desired tip angles between a phantom and a human subject in a constructed embodiment of FIG. 2. Tuneup thus takes less than one minute.

Line (d) of FIG. 5 illustrates a sequence in which the 90° and 180° r.f. signals are transmitted by the r.f. coil of FIG. 2, and the spin echo signal 104A is received by an auxiliary coil, such as coil 18 in FIG. 1. Line (f) shows that netowrk B is again activated during the times of r.f. transmission to provide the r.f. coil with a low Q characteristic. During the times that the r.f. coil is transmitting network A is turned off so that the r.f. coil will be resonant in its low Q state. During all other times, particularly the time that the auxiliary coil is receiving the spin echo signal 104A, network A is turned on to destroy the resonance of the r.f. coil. There is thus no substantial interaction between the two coils when network A is turned on.

Alternatively, it may be desired to switch network A off during all times except when the auxiliary coil is receiving NMR signals.

The switching of the networks illustrated in FIG. 5 may be accomplished by using control signals conventionally found in commercially available NMR imaging equipment. As shown in FIG. 2, the transmitter/receiver 30 is activated for transmission by an RF ENABLE control line. The signal on this line is also applied to the DC voltage controller 34 to switch on its +24 V. DC supply when network B is to be activated during r.f. transmission. The DC voltage controller 34 also receives a COIL SELECT signal from the console of the NMR system. This signal assumes a predetermined state (either a logical "high" or a logical "low") whenever the user connects an auxiliary coil to the system. The COIL SELECT control signal may be logically combined to the RF ENABLE control signal and the result inverted to provide the switching sequence for network A shown in line (e) of FIG. 5.

Thus, the illustrated embodiments provides r.f. control techniques which are not affected by r.f. signal conditions but are externally DC controlled. The control techniques also do not contribute r.f. signal losses which would undesirably affect the tuning of the r.f. coil during its high Q condition.

What is claimed is:

1. In a magnetic resonance system, radio frequency (r.f.) apparatus for generating magnetic resonance in a subject at a given frequency in a magnetic field, and thereafter receiving NMR signals from said subject comprising:
   an r.f. coil arrangement; and
   means, coupled to said r.f. coil arrangement, for controllably causing said r.f. coil arrangement to exhibit relatively moderate sensitivity to a relatively broad band of frequencies including said given frequency during the generation of magnetic resonance, and to exhibit relatively high sensitivity to a relatively narrow band of frequencies including said given frequency during the reception of NMR signals.

2. The magnetic resonance system of claim 1, wherein said r.f. coil arrangement is nominally a high Q coil when receiving NMR signals, and said controllably causing means changes said coil to a low Q coil when the coil is transmitting r.f. signals.

3. The magnetic resonance system of claim 1, wherein said controllably causing means includes a loading coil which is selectively inductively coupled to said r.f. coil arrangement.

4. The magnetic resonance system of claim 1, wherein said r.f. coil arrangement includes an auxiliary r.f. coil arrangement which is tuned to said given frequency when active in the magnetic resonance system, and further comprising means for selectively detuning said auxiliary r.f. coil arrangement away from said given frequency during periods when said auxiliary r.f. coil arrangement is inactive in said system.

5. The magnetic resonance system of claim 4, wherein said means for selectively detuning includes a diode switch which is switched by a selectively applied DC current.

* * * * *